US012666610B2

(12) United States Patent
Wu et al.

(10) Patent No.: US 12,666,610 B2
(45) Date of Patent: Jun. 23, 2026

(54) SEMICONDUCTOR STRUCTURE AND MEMORY

(71) Applicant: CXMT CORPORATION, Hefei City (CN)

(72) Inventors: Qilong Wu, Hefei (CN); Chih-Cheng Liu, Hefei (CN); Tzung-Han Lee, Hefei (CN)

(73) Assignee: CXMT CORPORATION, Hefei City (CN)

( * ) Notice: Subject to any disclaimer, the term of this patent is extended or adjusted under 35 U.S.C. 154(b) by 393 days.

(21) Appl. No.: 18/530,183

(22) Filed: Dec. 5, 2023

(65) Prior Publication Data

US 2024/0130119 A1 Apr. 18, 2024

Related U.S. Application Data

(63) Continuation of application No. PCT/CN2022/124056, filed on Oct. 9, 2022.

(30) Foreign Application Priority Data

Sep. 2, 2022 (CN) .......................... 202211070194.3

(51) Int. Cl.
*H10B 12/00* (2023.01)
*G11C 11/408* (2006.01)

(52) U.S. Cl.
CPC .......... *H10B 12/50* (2023.02); *G11C 11/4085* (2013.01)

(58) Field of Classification Search
None
See application file for complete search history.

(56) References Cited

U.S. PATENT DOCUMENTS

| | | |
|---|---|---|
| 10,008,256 B1 | 6/2018 | Kim |
| 10,490,256 B2 | 11/2019 | Jeong |

(Continued)

FOREIGN PATENT DOCUMENTS

| | | |
|---|---|---|
| CN | 111446236 A | 7/2020 |
| CN | 113327635 A | 8/2021 |

(Continued)

OTHER PUBLICATIONS

International Search Report in the international application No. PCT/CN2022/124056, mailed on Mar. 22, 2023, 3 pages.

(Continued)

*Primary Examiner* — Alexander G Ghyka
(74) *Attorney, Agent, or Firm* — Syncoda LLC; Feng Ma

(57) ABSTRACT

A semiconductor structure includes at least one sub-word line driver. The sub-word line driver includes a plurality of first active areas and a main-word line. The main-word line includes a plurality of first gates and a plurality of second gates interconnected. The plurality of first gates correspond to the plurality of first active areas. An extension direction of the plurality of first gates in the main-word line and/or an extension direction of at least part of the second gates in the main-word line intersects both a first direction and a second direction. The first direction is parallel to a direction in which the first active areas extend, and the second direction is parallel to a plane in which the first active areas are located and is perpendicular to the first direction.

20 Claims, 16 Drawing Sheets

(56) References Cited

U.S. PATENT DOCUMENTS

| | | | | |
|---|---|---|---|---|
| 10,892,004 | B2 | 1/2021 | Jeong | |
| 11,289,140 | B2 | 3/2022 | Jeong | |
| 2007/0070688 | A1* | 3/2007 | Kuo | G11C 8/08 |
| | | | | 365/158 |
| 2008/0112253 | A1 | 5/2008 | Youn | |
| 2008/0278987 | A1 | 11/2008 | Yang | |
| 2009/0052264 | A1* | 2/2009 | Hong | G11C 29/50 |
| | | | | 365/201 |
| 2009/0213647 | A1* | 8/2009 | Choi | G11C 13/0004 |
| | | | | 365/163 |
| 2017/0005096 | A1 | 1/2017 | Lee | |
| 2018/0166119 | A1 | 6/2018 | Jeong | |
| 2018/0182448 | A1 | 6/2018 | Kim | |
| 2020/0051611 | A1 | 2/2020 | Jeong | |
| 2021/0272613 | A1 | 9/2021 | Jeong | |
| 2022/0044725 | A1* | 2/2022 | Park | G11C 11/4091 |
| 2022/0111517 | A1* | 4/2022 | Bennice | B25J 9/1605 |
| 2022/0172759 | A1 | 6/2022 | Jeong | |
| 2022/0254788 | A1 | 8/2022 | Yokomichi | |
| 2022/0406781 | A1* | 12/2022 | Sakui | G11C 11/406 |

FOREIGN PATENT DOCUMENTS

| | | |
|---|---|---|
| CN | 114864538 A | 8/2022 |
| CN | 114913891 A | 8/2022 |
| JP | 2000187978 A | 7/2000 |
| WO | 2022066462 A1 | 3/2022 |

OTHER PUBLICATIONS

First Office Action of the Chinese application No. 202211070194.3, issued on Oct. 20, 2022, 9 pages with English abstract.
Notice of Allowance of the Chinese application No. 202211070194.3, issued on Nov. 10, 2022, 4 pages with English abstract.

* cited by examiner 303    302    301

<u>300</u>

402b                    401

402a

Y

O → X

SEMICONDUCTOR STRUCTURE AND MEMORY

CROSS-REFERENCE TO RELATED APPLICATIONS

This is a continuation of International Application No. PCT/CN2022/124056 filed on Oct. 9, 2022, which claims priority to Chinese Patent Application No. 202211070194.3 filed on Sep. 2, 2022. The disclosures of the above-referenced applications are hereby incorporated by reference in their entirety.

BACKGROUND

In a semiconductor structure, such as dynamic random access memory (DRAM), a word line may be used as a conductive wire for transmitting gate voltages required to drive one or more transistors of a memory cell. The transistor may be operated in response to a potential state of the word line, so that the dynamic random access memory can write data into or read data from the memory cell through the transistor.

With the increase of chip size and chip memory capacity, the line delay caused by such word line can be considered as one of the most important delay factors limiting the operation speed of dynamic random access memory. In order to minimize the line delay of such word line, sub-word line drivers (SWD) for dividing a long main-word line (MWL) into a plurality of sub-word lines (SWL) and driving each of the sub-word lines have been developed.

SUMMARY

The disclosure relates to the technical field of semiconductors, and in particular to a semiconductor structure and a memory.

According to an aspect of the disclosure, there is provided a semiconductor structure including at least one sub-word line driver. The sub-word line driver includes a plurality of first active areas and a main-word line.

The main-word line includes a plurality of first gates and a plurality of second gates interconnected. The plurality of first gates correspond to the plurality of first active areas.

At least one of an extension direction of the plurality of first gates in the main-word line or an extension direction of at least part of the second gates in the main-word line intersects both a first direction and a second direction. The first direction is parallel to a direction in which the first active areas extend, and the second direction is parallel to a plane in which the first active areas are located and is perpendicular to the first direction.

According to another aspect of the disclosure, there is provided a memory including the semiconductor structure according to the above embodiments of the disclosure.

Figure 1A:
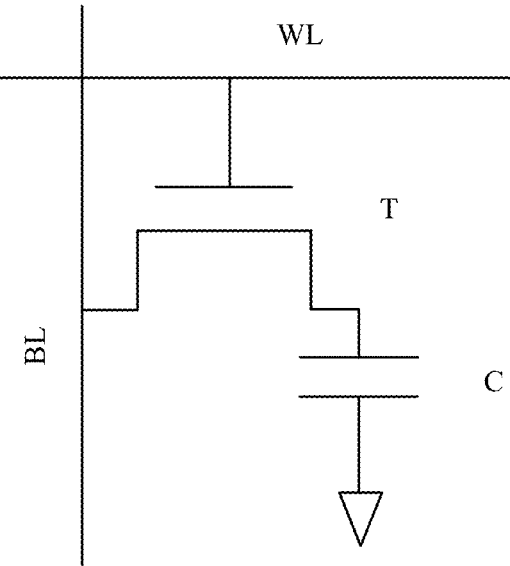
FIG. 1A is a schematic diagram of partial circuit of a memory provided in an embodiment of the disclosure.

In the above figures (which are not necessarily drawn to scale), similar reference numerals may describe similar components in different views. Similar reference numerals with different letter suffixes may represent different examples of similar components. The figures generally illustrate the various embodiments discussed herein by way of example, rather than limitation.

DETAILED DESCRIPTION

In order to make the technical solutions and advantages of the embodiments of the present disclosure clearer, the technical solutions of the disclosure will be further explained in detail below with reference to the figures and embodiments. Although exemplary implementations of the disclosure are shown in the figures, it is to be understood that the disclosure may be embodied in various forms and should not be limited by the implementations set forth herein. On the contrary, these implementations are provided to enable a more thorough understanding of the disclosure and a full conveying of the scope of the disclosure to those skilled in the art.

The disclosure will be described in more detail by way of example with reference to the figures in the following paragraphs. The advantages and features of the disclosure will become more apparent from the following description and the claims. It is to be noted that the figures each are provided in a very simplified form with an inaccurate scale only for the purpose of assisting in illustrating the embodiments of the disclosure in a convenient and clear way.

It is understandable that the meanings of "on", "above" and "over" in the disclosure should be interpreted in the broadest manner, so that "on" not only means "on" something without intervening features or layers therebetween (that is, directly on something), but also includes "on" something with intervening features or layers therebetween.

In addition, for ease of description, spatial relative terms such as "on . . . ", "above . . . ", "over . . . ", "up", "upper" and the like may be used herein to describe a relationship of an element or feature to another element or feature as shown in the figures. In addition to the orientations depicted in the figures, the spatial relative terms are intended to encompass different orientations of a device in use or operation. The device may be oriented in other ways (rotated 90 degrees or in other orientations) and also the spatial relative descriptors used herein may be interpreted accordingly.

In the embodiments of the disclosure, the term "substrate" refers to a material on which a subsequent layer of material is added. The substrate itself may be patterned. The material added on a top of the substrate may be patterned or may remain not patterned. In addition, the substrate may include a variety of semiconductor materials, such as silicon, silicon germanium, germanium, gallium arsenide, indium phosphide, and the like. Alternatively, the substrate may be made of a non-conductive material, such as glass, plastic or sapphire wafer.

In the embodiments of the disclosure, the term "layer" refers to a portion of material that includes a region having a thickness. The layer may extend over an entirety of a lower or upper structure, or may have a range smaller than a range of the lower or upper structure. Further, the layer may be a region of a homogeneous or heterogeneous continuous structure whose thickness is less than a thickness of the continuous structure. For example, the layer may be located between a top surface and a bottom surface of the continuous structure, or the layer may be located between any pair of horizontal surfaces at the top and bottom surfaces of the continuous structure. The layer may extend horizontally, vertically, and/or along an inclined surface. The layer may include multiple sublayers. For example, a interconnect layer may include one or more conductor and contact sublayers in which interconnect lines and/or via contacts are formed, and one or more dielectric sublayers.

In the embodiments of the disclosure, the terms "first", "second" and the like are used to distinguish similar objects and are not necessarily used to describe a particular order or sequence.

The semiconductor structure according to the embodiments of the disclosure will be used in a subsequent process to form at least a part of a final device structure. The final device may include a memory including, but not limited to, dynamic random access memory, which is described below only as an example and not used to limit the scope of the disclosure.

With the development of dynamic random access memory technology, an architecture of a memory cell array has changed from $8F^2$ to $6F^2$ and then to $4F^2$. However, regardless of the array architecture $8F^2$ or $4F^2$, a dynamic random access memory is composed of a plurality of memory cells, and each of the memory cells is mainly composed of one transistor and one capacitor controlled by the transistor. That is, the dynamic random access memory is of architecture of one Transistor (T) and one Capacitor (C) (1T1C), the main action principle of which is to use an amount of charge stored in the capacitor to represent whether a binary bit is 1 or 0.

FIG. 1A is a schematic diagram of a memory using a 1T1C architecture provided in an embodiment of the disclosure. As shown in FIG. 1A, a drain of a transistor T is electrically connected with a bit line (BL), a source of the transistor T is electrically connected with one of electrode plates of a capacitor C, in which the other of the electrode plates of the capacitor C may be connected with a reference voltage, which may be a ground voltage or another voltage, and a gate of the transistor T is connected with a word line (WL). A voltage is applied through a word line WL to control the transistor T to be turned on or off, and a bit line BL is used to perform a read or write operation on the transistor T when the transistor T is turned on.

Figure 1B:
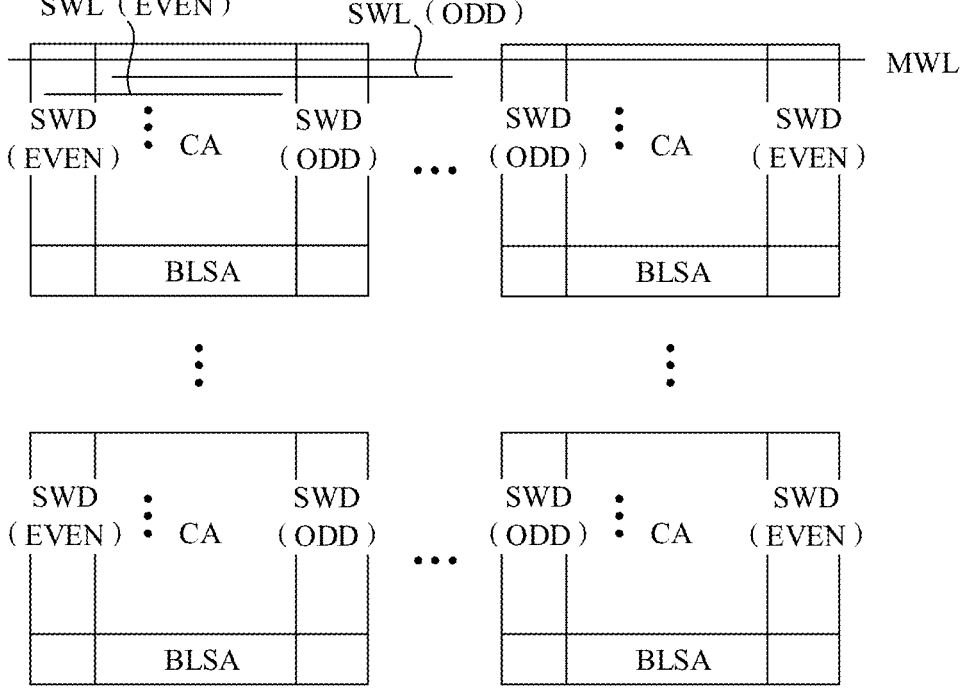
FIG. 1B is a schematic layout diagram of a semiconductor structure with sub-word line drivers provided in an embodiment of the disclosure.

FIG. 1B is a schematic layout diagram of a semiconductor structure with sub-word line drivers provided in an embodiment of the disclosure. As shown in FIG. 1B, a dynamic random access memory may include at least one memory cell array (CA) and a circuit for controlling the cell array including main-word lines. FIG. 1B illustrates a plurality of memory cell arrays CA. Each of the memory cell arrays CA may include at least one bit line sense amplifier (BLSA) and at least one sub-word line driver SWD.

Each of the memory cell arrays CA may include a plurality of memory cells in an array for storing data. The memory cell array may include a plurality of sub-word lines SWL, each of which may be coupled to a plurality of memory cells. The plurality of sub-word lines may be disposed sequentially and successively above the memory cell array, and the plurality of sub-word lines may be connected to a main-word line MWL.

As mentioned above, in order to minimize the line delay of a main-word line, a plurality of sub-word line drivers dividing a long main-word line and main-word line driver into a plurality of sub-word lines for driving each corresponding sub-word line have been developed. The sub-word line drivers can selectively drive one or more sub-word lines in response to a main-word line drive signal. In this case, the main-word line drive signal can represent a memory cell drive signal transmitted through the main-word line.

In FIG. 1B, the sub-word line drivers may be divided into an even sub-word line driver circuit (EVEN SWD) disposed along a side of the memory cell arrays and an odd memory cell array driver circuit (ODD SWD) disposed along an opposite side with respect the memory cell arrays. The even sub-word line driver circuit may drive one or more even sub-word lines, and the odd sub-word line driver circuit may drive one or more odd sub-word lines. It is to be understood that the even sub-word line driver circuit and the odd sub-word line driver circuit have basically similar structures. The even sub-word line driver circuit and the odd sub-word line driver are collectively referred to as sub-word line drivers below. The sense amplifier may sense and amplify cell data of the associated memory cell array. The sense amplifier may be arranged along another side of the memory cell array.

Figure 2:
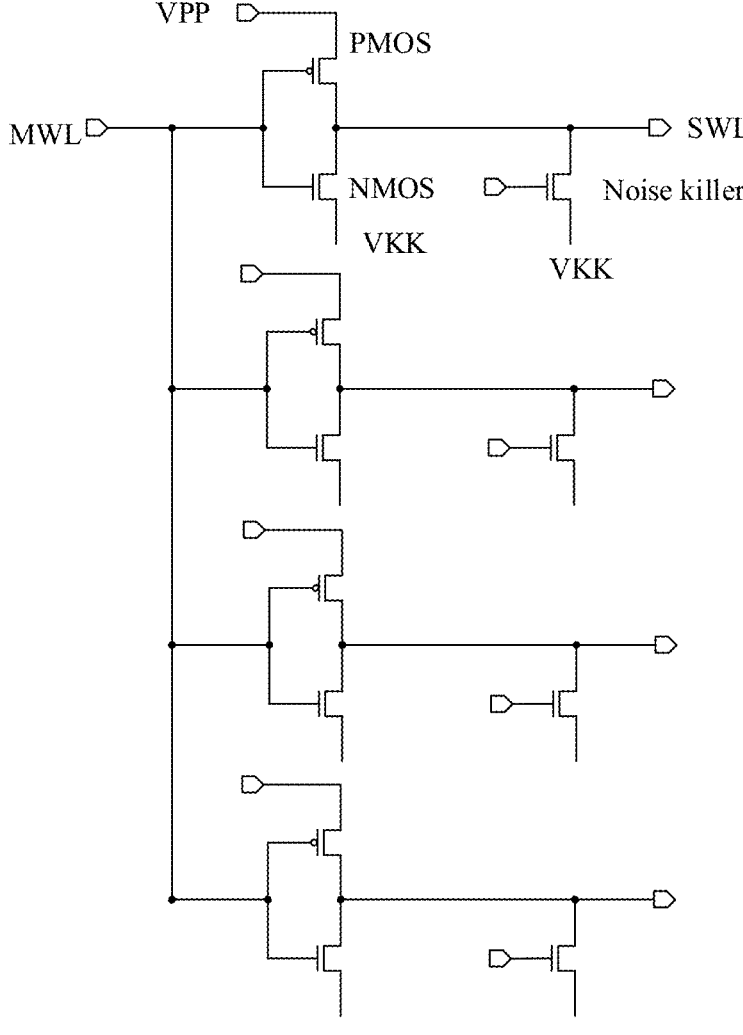
FIG. 2 is a schematic circuit diagram of sub-word line drivers provided in an embodiment of the disclosure.

FIG. 2 shows a schematic circuit diagram of sub-word line drivers in an embodiment. As shown in FIG. 2, a sub-word line driver is used to drive four sub-word lines, including four P-metal-oxide-semiconductor (PMOS) transistors and four N-metal-oxide-semiconductor (NMOS) transistors. In other words, each of the sub-word lines SWL includes one PMOS transistor and one NMOS transistor. The PMOS transistor and the NMOS transistor can form an inverter for controlling a switching state of the target sub-word line. Exemplarily, a transistor control voltage VPP turns the sub-word line on, or a control voltage VKK turns the sub-word line off. It is to be noted that gates corresponding to the four PMOS transistors and the four NMOS transistors are connected to each other to form a main-word line MWL. The sub-word line driver also includes transistors which are connected with both a group of PMOS transistors and NMOS transistors. The transistors are noise killers. The noise killers can be used to input, when a certain sub-word line is turned on, VKK voltage to other sub-word lines to turn them off so as to prevent the signal turning on the sub-word line from being affected. It is to be noted that the sub-word line driver circuit shown in FIG. 2 is only used as an example, and is not used to limit a circuit structure of the sub-word line driver in the embodiments of the disclosure.

Figure 3A:
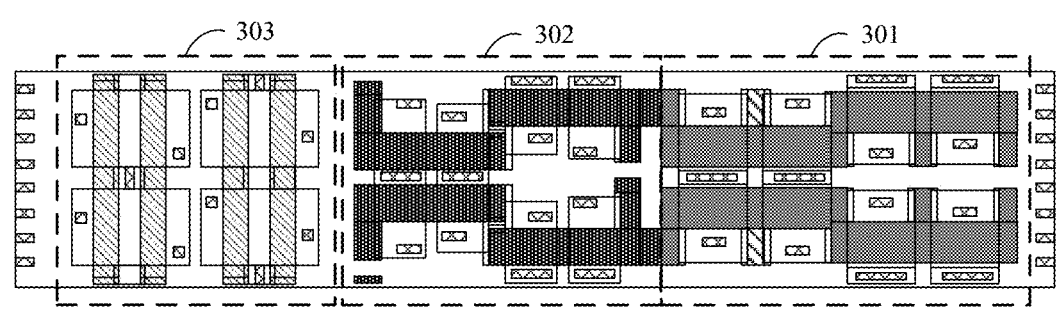
FIG. 3A is a schematic diagram of a wiring way of sub-word line drivers provided in an embodiment of the disclosure.
Figure 3B:
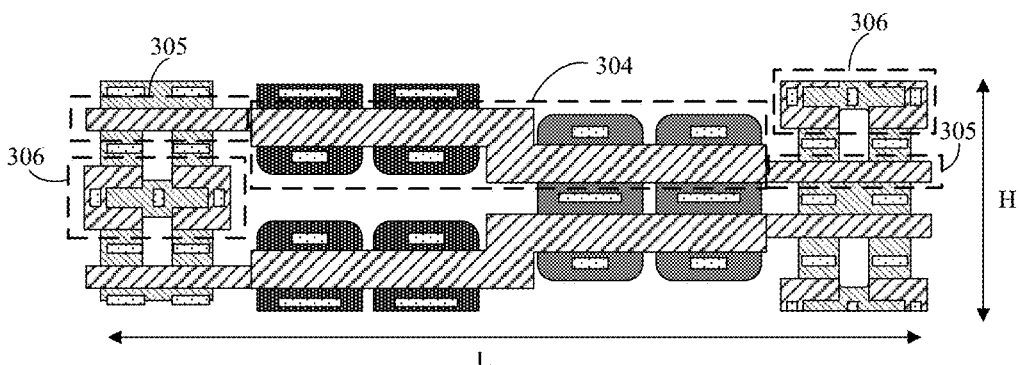
FIG. 3B is a schematic diagram of another wiring way of sub-word line drivers provided in an embodiment of the disclosure.

In order to reduce a delay time and an area occupied by the sub-word line driver, the wiring way of the elements in the sub-word line driver are particularly important. FIGS. 3A and 3B show two different wiring ways of the sub-word line drivers. It is to be noted that each of FIGS. 3A and 3B corresponds to two (two groups of) main-word line drivers shown in FIG. 2. As shown in FIG. 3A, a region corresponding to 301 is a region in which PMOS transistors are disposed, a region corresponding to 302 is a region in which NMOS transistors are disposed, a region corresponding to 303 is a region in which noise killers are disposed. Gates of the PMOS transistors in the region corresponding to 301 and gates of the NMOS transistors in the region corresponding to 302 are connected to form a main-word line.

As shown in FIG. 3B, a region corresponding to 304 is a region in which the gates of the PMOS transistors are disposed, a region corresponding to 305 is a region in which the gates of the NMOS transistors are disposed, a region corresponding to 306 is a region in which noise killers are disposed. Gates of the PMOS transistors in the region corresponding to 304 and gates of the NMOS transistors in the regions corresponding to 305 arranged on both sides of the region 304 are connected to form a main-word line.

In practical application, an area of all the sub-word line drivers included in the semiconductor structure can be equivalent to a product of a length in an X-axis direction and a length in a Y-axis direction. The length in the Y-axis direction is determined by a pitch between the main-word lines and the number of the main-word lines (including a total number of actual word lines and dummy word lines), and the setting space is limited. Therefore, the area of the sub-word line drivers may be optimized by optimizing the length in the X-axis direction of the sub-word line drivers. It is to be noted that a length H shown in FIG. 3B may be understood as the length of the sub-word line drivers in the Y-axis direction, and a width L may be understood as the length of the sub-word line drivers in the X-axis direction.

As can be seen from FIGS. 3A and 3B, disposing the noise killers between the gates of two transistors can reduce the width L of the sub-word line drivers compared with disposing the noise killers on a side of the transistors. Moreover, the width of the sub-word line drivers is limited by design of the gates.

In view of this, the embodiment of the disclosure provides a semiconductor structure including at least one sub-word line driver. The sub-word line driver includes a plurality of first active areas and a main-word line.

The main-word line includes a plurality of first gates and a plurality of second gates interconnected. The plurality of first gates correspond to the plurality of first active areas.

An extension direction of the plurality of first gates in the main-word line and/or an extension direction of at least part of the second gates in the main-word line intersects both a first direction and a second direction. The first direction is parallel to a direction in which the first active areas extend, and the second direction is parallel to a plane on which the first active areas are located and is perpendicular to the first direction.

Here and below, for the convenience of describing the embodiments of the disclosure, the first direction is an extension direction of the plurality of first active areas. The extension direction of each of the plurality of first active areas is the same and is the first direction. The second direction is a direction perpendicular to the first direction and parallel to a plane in which the first active areas are located. In some specific examples, the first direction may be expressed as the Y-axis direction in the figures. The second direction may be expressed as the X-axis direction in the figures. The plane in which the first active areas are located may be expressed as an XOY plane in the figures.

Here, a direction intersecting both the first direction and the second direction does not refer to a fixed direction, but may be understood as any direction parallel to the plane in which the first active areas are located, and neither parallel to the first direction nor parallel to the second direction.

Here, the plurality of first gates are physically connected to form a first conductive wire. The plurality of second gates are physically connected to form a second conductive wire. It is to be noted that, in the embodiments of the disclosure, in each main-word line, the plurality of first gates can form one first conductive wire, and the plurality of second gates can form one or two second conductive wires. The first conductive wire and the second conductive wire(s) are all connected to form the main-word line.

In some specific embodiments, each main-word line may include one first conductive wire and one second conductive wire. An end of the first conductive wire is connected with an end of the second conductive wire, and positions of the first conductive wire and the second conductive wire may be interchanged. In this case, the first conductive wire and the second conductive wire may be arranged as follows. An extension direction of the first conductive wire intersects both the first direction and the second direction, and an extension direction of the second conductive wire is parallel to the second direction. Alternatively, the extending direction of the first conductive wire is parallel to the second direction, and the extending direction of the second conductive wire intersects both the first direction and the second direction. Alternatively, the extension direction of the first conductive wire intersects both the first direction and the second direction, and the extension direction of the second conductive wire also intersects both the first direction and the second direction.

In some specific embodiments, each main-word line may include one first conductive wire and two second conductive wires. The two second conductive wires are located on either side of the first conductive wire respectively. In this case, the first conductive wire and the second conductive wires may be arranged as follows. An extension direction of the first conductive wire intersects both the first direction and the second direction, an extension direction of one of the two second conductive wires is parallel to the second direction, and an extension direction of the other one of the second conductive wires intersects both the first direction and the second direction. Alternatively, the extending direction of the first conductive wire is parallel to the second direction, and the extending directions of the two second conductive wires intersect both the first direction and the second direction. Alternatively, the extension direction of the first conductive wire intersects both the first direction and the second direction, and the extension directions of the two second conductive wires intersect both the first direction and the second direction. The extension direction of the first conductive wire may intersect or be perpendicular to the extension directions of the second conductive wires.

It is to be noted that the transistor types characterized by the first gates and the second gates are different, and the transistor types characterized by the first gates and the second gates are interchangeable. Exemplarily, the transistors corresponding to the first gates may include PMOS transistors, and the transistors corresponding to the second gates may include NMOS transistors. Alternatively, the transistors corresponding to the first gates may include NMOS transistors, and the transistors corresponding to the second gates may include PMOS transistors.

In order to facilitating the understanding of the concept of the disclosure, the specific arrangements of the first conductive wire and the second conductive wires are illustrated in detail below in combination with the figures. FIGS. 4A to 4D show a plurality of different wiring ways of the sub-word line drivers. It is to be noted that a semiconductor structures may include at least one sub-word line driver in the embodiments of the disclosure. FIGS. 4A to 4D all show a case where the semiconductor structure includes two sub-word line drivers. In addition, for convenience of subsequent calculation and comparison, a total length of the first conductive wire and a total length of the second conductive wires are set to be the same, and directions intersecting both the first direction and the second direction are set to have an included angle of 45° with both the first direction and the second direction. Moreover, the width L of the sub-word line drivers in the X-axis direction in FIG. 3B when both the first conductive wire and the second conductive wires extend in the second direction is taken as a reference value.

Figure 4A:
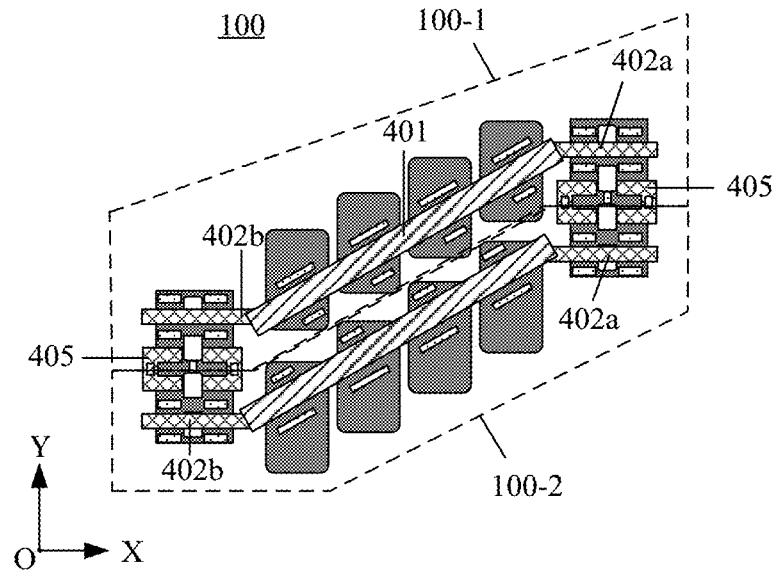
FIG. 4A is a schematic diagram of a semiconductor structure provided in an embodiment of the disclosure, in which first conductive wires extend in a direction intersecting both a first direction and a second direction.

As shown in a semiconductor structure 100 corresponding to FIG. 4A, a first conductive wire 401 extends in a direction intersecting both the first direction and the second direction, and second conductive wires (402a, 402b) are parallel to the second direction. In this case, a projection width of the first conductive wire 401 in the second direction is smaller than a width of the first conductive wire 401 in the second direction when the first conductive wire 401 is disposed in the second direction. According to calculation, the width of a sub-word line driver in the second direction in FIG. 4A is reduced by 29.3% compared with the reference value.

Figure 4B:
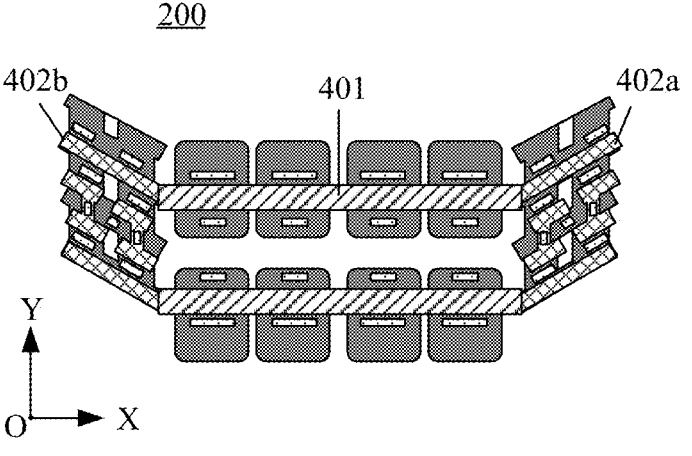
FIG. 4B is a schematic diagram of a semiconductor structure provided in an embodiment of the disclosure, in which second conductive wires extend in a direction intersecting both a first direction and a second direction.

As shown in a semiconductor structure 200 corresponding to FIG. 4B, second conductive wires (402a, 402b) extend in directions intersecting both the first direction and the second direction, and a first conductive wire 401 is parallel to the second direction. A projection width of the second conductive wires (402a, 402b) in the second direction is smaller than a width of the second conductive wires (402a, 402b) in the second direction when the second conductive wires (402a, 402b) are disposed in the second direction. According to calculation, the width of the sub-word line driver in the second direction is reduced by 29.3% compared with the reference value.

Figure 4C:
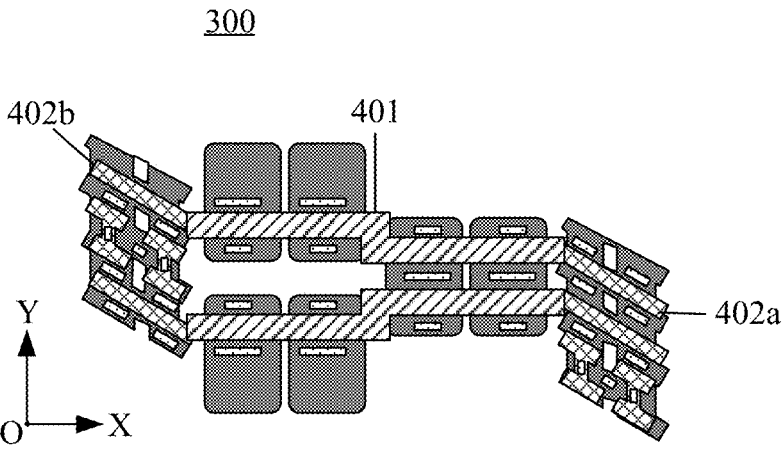
FIG. 4C is a schematic diagram of another semiconductor structure provided in an embodiment of the disclosure, in which second conductive wires extend in a direction intersecting both a first direction and a second direction.

A semiconductor structure 300 corresponding to FIG. 4C differs from the semiconductor structure 200 shown in FIG. 4B in that shapes of the first conductive wires 401 are different and the extension directions of two portions (402a, 402b) of the second conductive wires are different. Both the semiconductor structure 300 and the semiconductor structure 200 have the same width in the second direction. According to calculation, the width of the sub-word line driver in the second direction is reduced by 29.3% compared with the reference value.

Figure 4D:
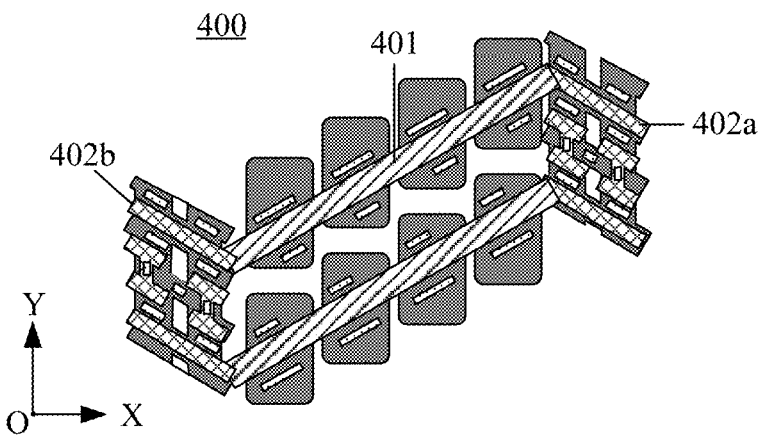
FIG. 4D is a schematic diagram of a semiconductor structure provided in an embodiment of the disclosure, in which first conductive wires and second conductive wires all extend in a direction intersecting both a first direction and a second direction.

As shown in a semiconductor structure 400 corresponding to FIG. 4D, both a first conductive wire 401 and second conductive wires (402a, 402b) extend in directions intersecting both the first direction and the second direction. A width of the first conductive wire 401 and a width of the second conductive wires (402a, 402b) in the second direction are both reduced. According to calculation, the width of the sub-word line driver in the second direction is reduced by 58.6% compared with the reference value.

However, when the first conductive wire and/or the second conductive wires intersect both the first direction and the second direction, the width of the first conductive wire and/or the second conductive wires in the first direction is relatively increased. The increased width is related to the included angle between the first conductive wire or the second conductive wires and the second direction. According to calculation, when the included angle between the first conductive wire and the second direction and the included angle between the second conductive wires and the second direction are both $\alpha$, the area of the sub-word line driver is reduced by $1-(2-2\cos\alpha)/4$. Exemplarily, when the included angle $\alpha$ is 45°, the area of the sub-word line driver is reduced by 14.6%.

It is to be understood that, by setting an extension direction of at least one of a connecting line formed by the plurality of first gates and a connecting line formed by at least part of the second gates in a main-word line to intersect both the first direction and the second direction, the width of the main word line in the second direction can be reduced in different degrees under the premise of keeping a channel length unchanged, thereby achieving the purpose of reducing the area of the sub-word line driver.

In practical application, considering that when an angle between the direction, which intersects both the first direction and the second direction, and the second direction is larger than the preset angle, there are two problems: on one hand, the length of the main-word line in the first direction increases too much; on the other hand, the active areas corresponding to the adjacent gates in the main-word line may overlap and intersect. Therefore, further defining the angle between the extension direction of the first conductive wire or the second conductive wires and the second direction can optimize the above two existing problems. In some embodiments, the preset angle is 45°.

In some embodiments, the plurality of first gates are connected physically and all extend in a third direction. The plurality of first active areas are arranged at intervals in the third direction. At least part of the second gates are connected physically and all extend in a fourth direction. An included angle between a straight line in the third direction and a straight line in the second direction ranges from 0° to 45°; and/or, an included angle between a straight line in the fourth direction and the straight line in the second direction ranges from 0° to 45°.

For example, in some embodiments, the plurality of first gates are physically connected and all extend in the third direction The plurality of second gates is physically connected to one end of the plurality of first gates and all extend in the fourth direction.

For example, in some embodiments, the plurality of first gates are physically connected and all extend in the third direction. A part of the second gates are physically connected to one end of the plurality of first gates and all extend in the fourth direction. Another part of the second gates are physically connected to another end of the plurality of first gates and all extend in the fifth direction. An included angle between a straight line in the fifth direction and the straight line in the second direction ranges from 0° to 45°.

Here, the third direction is the extension direction of the first conductive wire, which is a direction intersecting both the first direction and the second direction. The fourth direction and the fifth direction are both extension directions of parts of the second conductive wires, and are both directions intersecting both the first direction and the second direction. When the second conductive wires are only located on one side of the first conductive wire, the second conductive wires only extend in the fourth direction. When the second conductive wires are located on both sides of the first conductive wire, the second conductive wires extend in the fourth direction and the fifth direction, respectively. Considering that the above two problems may exist when the preset angle is too large, in an embodiment of the disclosure, an included angle between each of straight lines in the third direction, the fourth direction and the fifth direction and the straight line in the second direction are set to range from 0° to 45°.

It is to be noted that the plurality of first active areas corresponding to the first conductive wire are arranged at intervals in the extension direction of the first conductive wire.

Figure 5A:
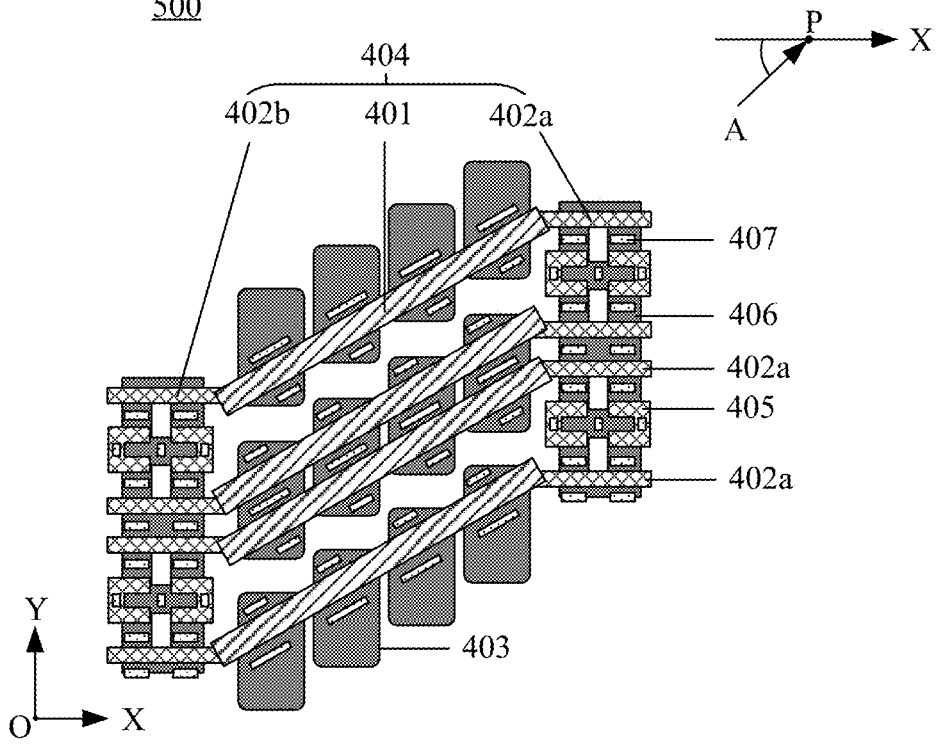
FIG. 5A is a schematic diagram of another semiconductor structure provided in an embodiment of the disclosure, in which first conductive wires extend in a direction intersecting both a first direction and a second direction.

Exemplarily, referring to FIG. 5A, a semiconductor structure 500 includes a plurality of first active areas 403 and four main-word lines 404. Each of the main-word lines 404 includes a first conductive wire 401 and second conductive wires (402a, 402b). The second conductive wires (402a, 402b) are respectively located on either side of the first conductive wires 401. Each of the first conductive wires 401 extends in a third direction (referring to AP direction in FIG. 5A), and both the second conductive wires (402a, 402b) extend in a fourth direction (here, the fourth direction is parallel to the X-axis direction in the FIG. 5A.

Figure 5B:
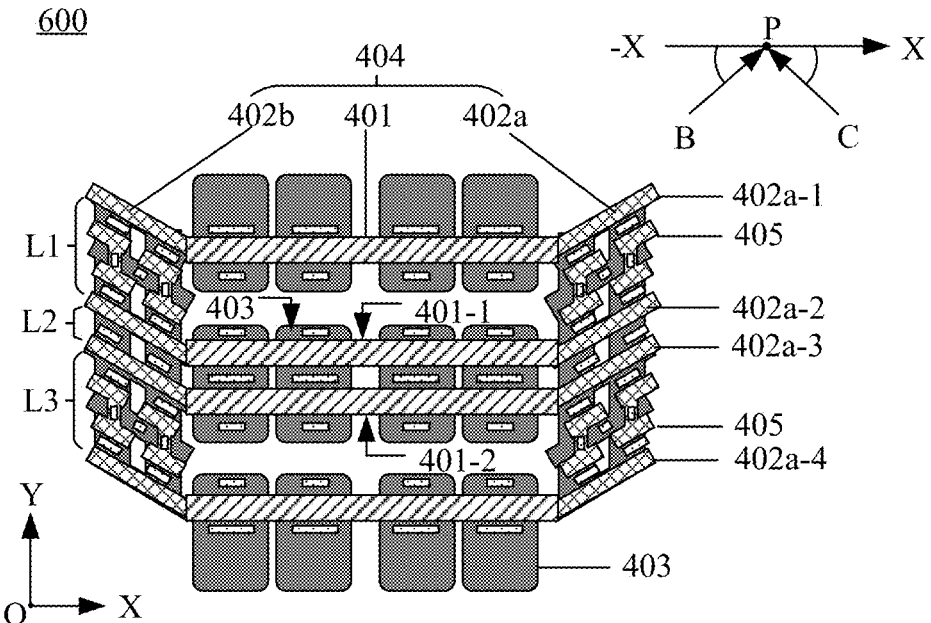
FIG. 5B is a schematic diagram of another semiconductor structure provided in an embodiment of the disclosure, in which second conductive wires extend in a direction intersecting both a first direction and a second direction.

Exemplarily, referring to FIG. 5B, in a semiconductor structure 600, each main-word line 404 includes a first conductive wire 401 and second conductive wires (402a, 402b). The second conductive wires (402a, 402b) are located on either side of the first conductive wire 401, respectively. The first conductive wire 401 extends in the third direction (Here, the third direction is parallel to the X-axis direction in FIG. 5B). Part of the second conductive wires 402a extends in the fourth direction (referring to BP direction in FIG. 5B), and the other part of the second conductive wires 402b extends in the fifth direction (referring to CP direction in FIG. 5B).

Figure 5C:
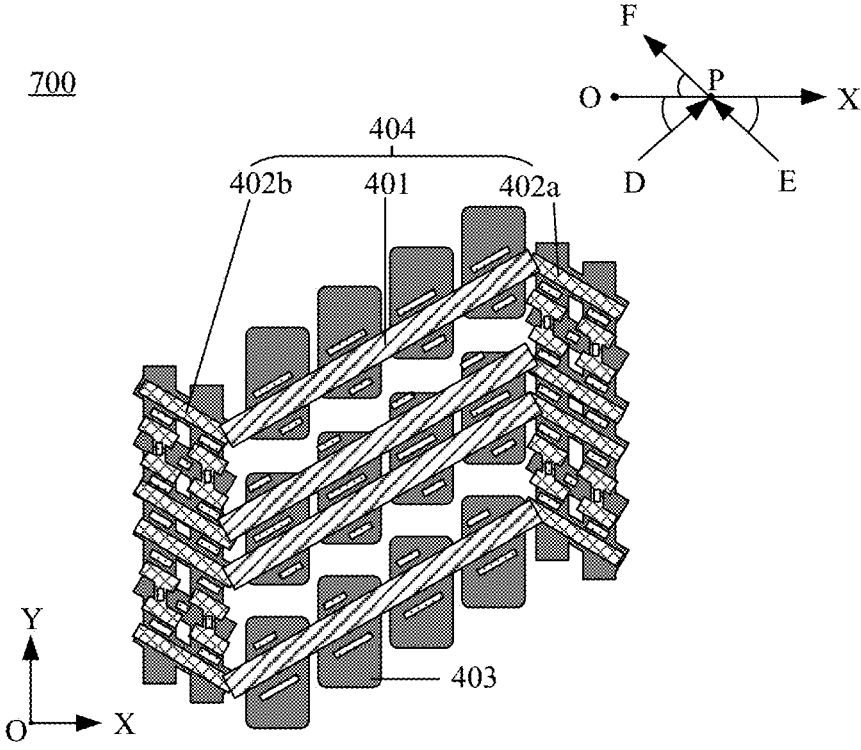
FIG. 5C is a schematic diagram of another semiconductor structure provided in an embodiment of the disclosure, in which first conductive wires and second conductive wires all extend in a direction intersecting both a first direction and a second direction.

Exemplarily, referring to FIG. 5C, in a semiconductor structure 700, each main-word line 404 includes a first conductive wire 401 and second conductive wires (402a, 402b). The second conductive wires (402a, 402b) are located on either side of the first conductive wire 401. The first conductive wire 401 extends in the third direction (referring to DP direction in FIG. 5C). Part of the second conductive wires 402a extends in the fourth direction (referring to EP direction in FIG. 5C). The other part of the second conductive wires 402b extends in the fifth direction (referring to PF direction in FIG. 5C).

Figure 5D:
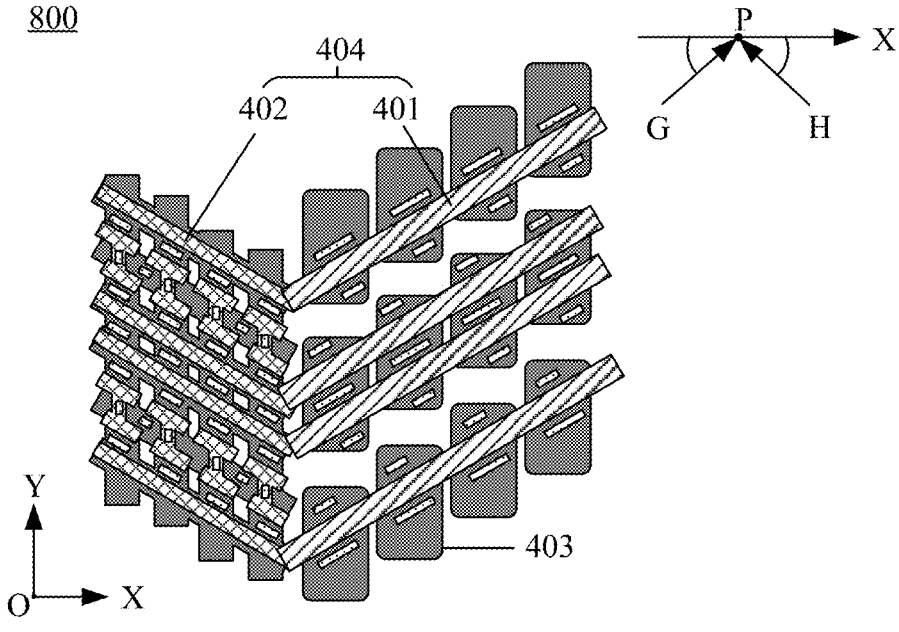
FIG. 5D is a schematic diagram of still another semiconductor structure provided in an embodiment of the disclosure, in which first conductive wires and second conductive wires all extend in a direction intersecting both a first direction and a second direction.

Exemplarily, referring to FIG. 5D, in a semiconductor structure 800, each main-word line 404 includes a first conductive wire 401 and a second conductive wire 402. The second conductive wire 402 is located only on one side of the first conductive wire 401. The first conductive wire 401 extends in the third direction (referring to GP direction in FIG. 5D). The second conductive wire 402 extends in the fourth direction (referring to HP direction in FIG. 5D).

It is to be noted that, in FIGS. 5A to 5D, when the third direction, the fourth direction and the fifth direction all intersect the first direction and the second direction, the values of the included angles between each of the straight lines in the third direction, the fourth direction and the fifth direction and the straight line in the second direction may be the same or different.

In some embodiments, the included angle between the straight line in the fourth direction and the straight line in the third direction is a first included angle. The included angle between the straight line in the fifth direction and the straight line in the third direction is a second included angle. The first included angle is equal to the second included angle.

Exemplarily, referring to FIG. 5B, the first included angle is ∠CPX, and the second included angle is ∠BP(–X). The first included angle is equal to the second included angle, i.e. ∠CPX=∠BP(–X).

Exemplarily, referring to FIG. 5C, the first included angle is the ∠DPE, and the second included angle is the ∠DPF. The first included angle is equal to the second included angle, i.e. the ∠DPE=∠DPF. In the case, the fourth direction is parallel to the fifth direction.

In some other embodiments, the first included angle is different from the second included angle.

It is to be understood that, when the first included angle is the same as the second included angle, the widths of the two parts of the second conductive wires in the second direction are reduced to the same extent, and also the lengths of the two parts (402a, 402b) of the second conductive wires in the first direction are changed to the same extent, which are beneficial to the control of the overall size of the second gates.

In some embodiments, the included angle between the straight line in the third direction and the straight line in the second direction is 45°. The plurality of first active areas are arranged at intervals in a stepping manner. The included angle between the straight line in the fourth direction and the straight line in the second direction is 45°. The included angle between the straight line in the fifth direction and the straight line in the second direction is 45°.

Exemplarily, referring to FIG. 5C, the included angle between the third direction and the X-axis direction is ∠DPO. The angle between the fourth direction and the X-axis direction is ∠EPX. The angle between the fifth direction and the X-axis direction is ∠OPF. ∠DPO=∠EPX=∠OPF=45°.

Combined with the previous calculation method, when the included angles of the third direction, the fourth direction and the fifth direction are all 45°, the width of the sub-word line driver in the second direction is reduced to the greatest extent compared with the reference value. Moreover, when the fourth direction is parallel to the fifth direction, but is not parallel to the third direction, the length of the sub-word line driver in the first direction is smaller than when the fourth direction is parallel to both the fifth direction and the third direction.

In some embodiments, the first gates as a whole extend in the third direction. Alternatively, the first gates include a first portion and a second portion extending in the third direction, and a third portion connecting the first portion and second portion.

Exemplarily, referring to FIGS. 5A, 5B, 5C and 5D, the first conductive wire 401 formed by connecting a plurality of first gates physically is linear. In some other embodiments, the first conductive wire 401 formed by connecting a plurality of first gates physically is in a "Z" shape or an inverse "Z" shape, as shown in FIGS. 6A and 6B.

Figure 6A:
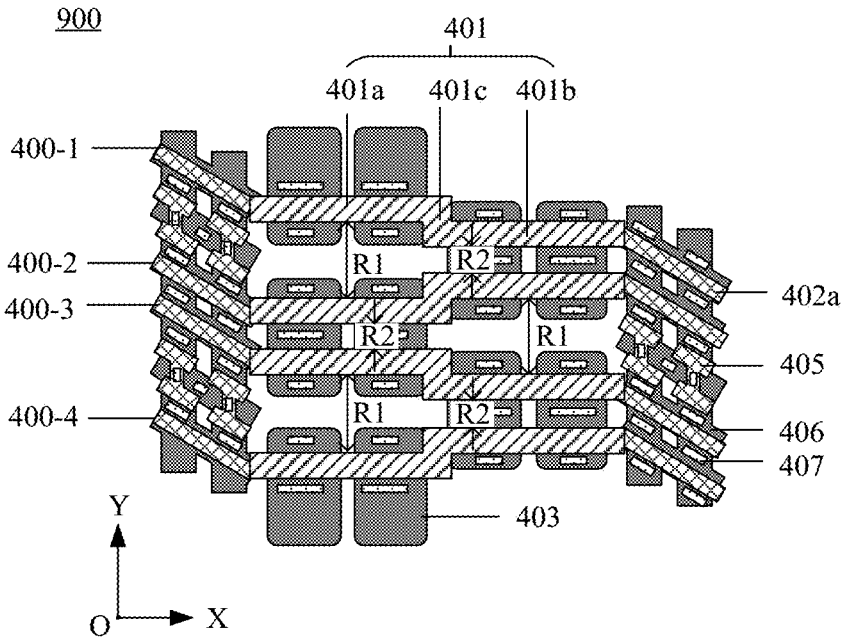
FIG. 6A is a schematic diagram of a semiconductor structure provided in an embodiment of the disclosure, in which each of the first conductive wires is in a "Z" shape.
Figure 6B:
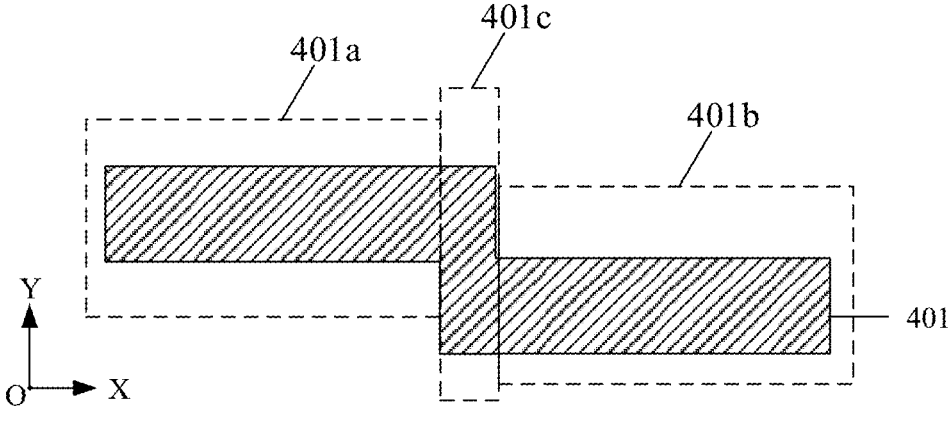
FIG. 6B is an enlarged schematic diagram of the first conductive wire in the "Z"-shape shown in FIG. 6A.

Specifically, referring to FIGS. 6A and 6B, the first conductive wire 401 includes a first portion 401*a*, a second portion 401*b*, and a third portion 401*c* interconnected. Both the first portion 401*a* and the second portion 401*b* extend in the third direction but not overlap, and the third portion 401*c* is used to connect the first portion 401*a* and the second portion 401*b*, thereby making the first conductive wire 401 to render in the "Z" shape or the inverse "Z" shape. The plurality of first conductive wires 401 in the shape of "Z" and the plurality of first conductive wires 401 in the shape of inverse "Z" are arranged alternatively in the semiconductor structure 900, so that a pitch between partial regions of two ones of the first wires 401 disposed adjacent to each other in the Y-axis direction can be larger, and other device structures, such as noise killers, may be arranged in the larger region according to requirements. There are related contents below, which will not be described in detail here.

It is to be noted that FIG. 6B is an enlarged schematic diagram of the first conductive wire 401 in the "Z" shape in FIG. 6A.

In some embodiments, the semiconductor structure includes N sub-word line drivers, where N is a positive integer greater than or equal to 1. The first gates connected physically in each of the N sub-word line drivers all are parallel and flush at both ends. The second gates connected physically in each of the N sub-word line drivers all are parallel and flush at both ends.

Exemplarily, referring to FIG. 5B, the semiconductor structure 600 includes N sub-word line drivers 404 in which N=4. Each of the sub-word line drivers 404 includes four first gates connected physically to form the first conductive wire 401. The four first gates are parallel, and are basically flush at both ends.

It is to be noted that each of the sub-word line drivers 404 includes four first gates and four first active areas 403 corresponding thereto. The four first active areas 403 are arranged at intervals in the third direction.

Exemplarily, referring to FIG. 5A, the semiconductor structure 500 includes N sub-word line drivers 404 in which N=4. Each of the sub-word line drivers 404 includes four second gates connected physically. Two of the second gates are located on one side of the first conductive wire 401, and another two of the second gates are located on another side of the first conductive wire 401. Here, the four second gates are parallel to each other, and are basically flush at both ends.

In some embodiments, the sub-word line driver further includes a plurality of third gates all located between the second gates of two adjacent ones of the N sub-word line drivers.

Referring to FIG. 5A, third gates 405 are also provided between two adjacent ones of the sub-word line drivers 404 in the semiconductor structure 500. The third gates 405 are located between two adjacent ones of the second gates (the second conductive wires 402*a*) arranged in parallel in the first direction.

In some embodiment, the sub-word line driver further includes at least one second active area corresponding to the plurality of second gates and the plurality of third gates. A shape of each of the first active areas is a strip shape. A shape of the second active area is a grid shape.

Referring to FIG. 5A, the shape of each of the first active areas 403 may be a strip shape, and the first gates correspond to the first active areas 403 one-to-one. The shape of the second active area 406 may be a strip shape or a grid shape. When the shape of the second active area 406 is a strip shape, one second gate corresponds to one second active area. When the shape of the second active area is a grid shape, the plurality of second gates correspond to one second active area. In addition, when the shape of the second active area 406 is a grid shape, the third gates located between two adjacent ones of the second gates also correspond to the second active area. That is, a plurality of second gates and a plurality of third gates share one second active area 406. In this way, fewer active areas can be provided, and thus an area of the sub-word line drivers is reduced.

It is to be noted that the third gates and their corresponding transistors may be used to form noise killers.

Figure 7:
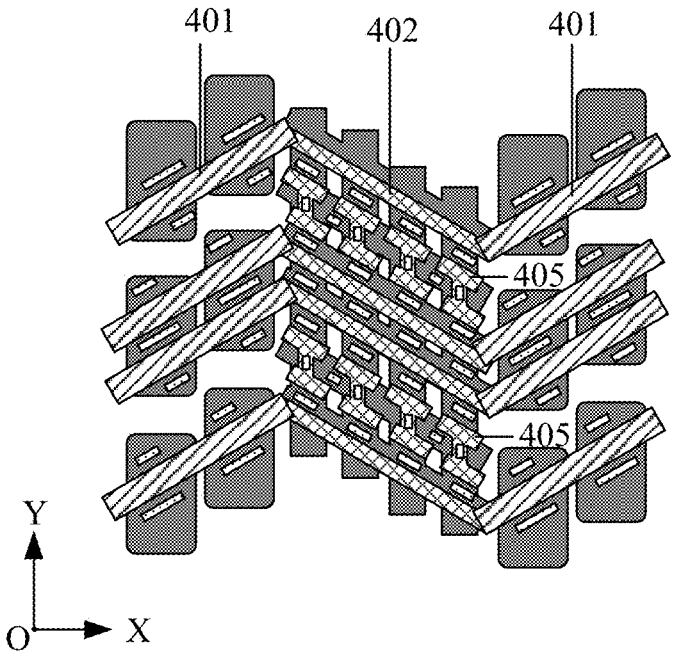
FIG. 7 is a schematic diagram of yet another semiconductor structure provided in an embodiment of the disclosure, in which first conductive wires and second conductive wires all extend in a direction intersecting both a first direction and a second direction.

Referring to FIG. 7, when a second conductive wire 402 is located between the two first conductive wire 401, third gates 405 are located between two adjacent second gates (i.e., adjacent second conductive wires 402) in the Y-axis direction. In addition, only one arrangement of the second conductive wires 402 and the first conductive wires 401 is shown in FIG. 7. Other types of arrangements may also be used in some other embodiments, and are not described in detail here.

In some embodiments, two adjacent ones of the third gates in the first direction are formed in a "C" shape or an "I" shape.

Referring to FIG. 5A, when the second conductive wires (402*a* or 402*b*) are parallel to the X-axis direction, the third gates 405 located between two ones of the second conductive wires (402*a* or 402*b*) adjacent in the Y-axis direction are in a "C" shape or an inverse "C" shape.

Referring to FIG. 6A, when the second conductive wires (402*a* or 402*b*) intersect the straight line in the X-axis direction, two of the third gates 405 disposed adjacent to each other in the Y-axis direction are in an "I" shape.

In some embodiments, the N sub-word line drivers include a first sub-word line driver and a second sub-word line driver disposed sequentially in the first direction. The third gates in the first sub-word line driver and the second sub-word line driver are all located between the second gates of the first sub-word line driver and the second gates of the second sub-word line driver.

Referring to FIG. 4A, the semiconductor structure 100 shown in FIG. 4A includes two sub-word line drivers, namely, a first sub-word line driver 100-1 and a second sub-word line driver 100-2 disposed adjacent to each other in the Y-axis direction. The third gates 405 are located between the second gates 402*a* of the first sub-word line driver 100-1 and the second gates 402*a* of the second sub-word line driver 100-2. Alternatively, the third gates 405 are located between the second gates 402*b* of the first sub-word line driver 100-1 and the second gates 402*b* of the second sub-word line driver 100-2.

In some embodiments, the N sub-word line drivers include a first sub-word line driver, a second sub-word line driver, a third sub-word line driver, and a fourth sub-word line driver disposed sequentially in the first direction. The first gates as a whole of the N sub-word line drivers extend in the first direction. A distance between the second gates of the first sub-word line driver and the second gates of the second sub-word line driver is L1. A distance between the second gates of the second sub-word line driver and the second gates of the third sub-word line driver is L2. A distance between the second gates of the third sub-word line driver and the second gates of the fourth sub-word line driver is L3. L1=L3, and L1>L2. The third gates of the N sub-word line drivers are located between the second gates of the first sub-word line driver and the second gates of the second sub-word line driver, and between the second gates of the third sub-word line driver and the second gates of the fourth sub-word line driver.

Referring to FIG. 5B, the semiconductor structure 600 shown in FIG. 5B includes four sub-word line drivers disposed sequentially in the first direction, i.e. a first sub-word line drive, a second sub-word line drive, a third sub-word line drive, and a fourth sub-word line drive. A distance between the second gates 402$a$-1 of the first sub-word line driver and the second gates 402$a$-2 of the second sub-word line driver is L1. A distance between the second gates 402$a$-2 of the second sub-word line driver and the second gates 402$a$-3 of the third sub-word line driver is L2. A distance between the second gates 402$a$-3 of the third sub-word line driver and the second gates 402$a$-4 of the fourth sub-word line driver is L3. L1>L2 and L3>L2. In some embodiments, L1=L3; therefore, L1=L3>L2.

In this case, in order to reduce a total area of the sub-word line drivers, the third gates 405 are disposed between the second gates 402$a$-1 of the first sub-word line driver and the second gates 402$a$-2 of the second sub-word line driver; and/or, the third gates 405 are disposed between the second gates 402$a$-3 of the third sub-word line driver and the second gates 402$a$-4 of the fourth sub-word line driver.

In some embodiments, there are active areas shared between the first gates of the second sub-word line driver and the first gates of the third sub-word line driver.

The semiconductor structure 600 shown in FIG. 5B includes a plurality of first gates 401-1 of the second sub-word line driver and a plurality of first gates 401-2 of the third sub-word line driver, and a plurality of first active areas 403. The distance between the first gates 401-1 of the second sub-word line driver and the first gates 401-2 of the third sub-word line driver adjacent in the Y-axis direction is L2. Correspondingly, the distance between the second gates 402$a$-2 of the second sub-word line driver and the second gates 402$a$-3 of the third sub-word line driver is also L2, which is relatively smaller than the distance L1 between the first sub-word line driver and the second sub-word line driver adjacent in the Y-axis direction. Therefore, each of the first gates 401-1 of the second sub-word line driver and a corresponding one of the first gates 401-2 of the third sub-word line driver may be allowed to share one first active area 403, so that the total area of the sub-word line drivers can also be reduced.

In some embodiments, the N sub-word line drivers include a first sub-word line driver, a second sub-word line driver, a third sub-word line driver, and a fourth sub-word line driver disposed sequentially in the first direction. The first gates of the N sub-word line drivers include first portions and second portions extending in the first direction and third portions connecting the first portions and second portions. A pitch between the first portions of the first gates of two adjacent ones of the sub-word line drivers is a first distance or a second distance. A pitch between the second portions of the first gates of two adjacent ones of the sub-word line drivers is the second distance or the first distance. The first distance is greater than the second distance. The third gates of the N sub-word line drivers are located between the second gates connected to the portions of two adjacent ones of the first gates with a pitch of the first distance in the N sub-word line drivers.

Referring to FIG. 6A, in the semiconductor structure 900, a plurality of first gates corresponding to the first sub-word line driver 400-1 are physically connected to form a first conductive wire which includes a first portion 401$a$ and a second portion 401$b$, and a third portion 401$c$ connecting the first portion and second portion. A plurality of first gates corresponding to the second sub-word line driver 400-2 are physically connected to form a first conductive wire which includes a first portion 401$a$ and a second portion 401$b$, and a third portion 401$c$ connecting the first portion and second portion. A plurality of first gates corresponding to the third sub-word line driver 400-3 are physically connected to form a first conductive wire which includes a first portion 401$a$ and a second portion 401$b$, and a third portion 401$c$ connecting the first portion and second portion. A plurality of first gates corresponding to the fourth sub-word line driver 400-4 are physically connected to form a first conductive wire 401 which includes a first portion 401$a$ and a second portion 401$b$, and a third portion 401$c$ connecting the first portion and second portion.

A distance between the first portion 401$a$ corresponding to the first sub-word line driver 400-1 and the first portion 401$a$ corresponding to the second sub-word line driver 400-2 is R1. A distance between the second portion 401$b$ corresponding to the first sub-word line driver 400-1 and the second portion 401$b$ corresponding to the second sub-word line driver 400-2 is R2.

A distance between the first portion 401$a$ corresponding to the second sub-word line driver 400-2 and the first portion 401$a$ corresponding to the third sub-word line driver 400-3 is R2. A distance between the second portion 401$b$ corresponding to the second sub-word line driver 400-2 and the second portion 401$b$ corresponding to the third sub-word line driver 400-3 is R1.

A distance between the first portion 401$a$ corresponding to the third sub-word line driver 400-3 and the first portion 401$a$ corresponding to the fourth sub-word line driver 400-4 is R1. A distance between the second portion 401$b$ corresponding to the third sub-word line driver 400-3 and the second portion 401$b$ corresponding to the fourth sub-word line driver 400-4 is R2.

Here, the first distance R1 is greater than the second distance R2. Therefore, a plurality of third gates corresponding to the N sub-word line drivers are arranged between the second gates connected to the portions with the first distance R1 apart of two ones of the first gates disposed adjacent to each other in the Y-axis direction. In other words, the third gates are located between two adjacent second gates, and a distance between the portions of two first gates respectively connected to the two adjacent second gates is the first distance R1.

In some embodiments, there are the first active areas shared between portions of two adjacent ones of the first gates with a pitch of the second distance in the N sub-word line drivers.

Referring to FIG. 6A, the distance between the second portion 401$b$ corresponding to the first sub-word line driver 400-1 and the second portion 401$b$ corresponding to the second sub-word line driver 400-2, the distance between the first portion 401$a$ corresponding to the second sub-word line driver 400-2 and the first portion 401$a$ corresponding to the third sub-word line driver 400-3, and the distance between the second portion 401$b$ corresponding to the third sub-word line driver 400-3 and the second portion 401*b* corresponding to the fourth sub-word line driver 400-4 are all the second distance R2. Therefore, in such regions, two adjacent ones of the first gates can share a first active area 403, so that the total area of the sub-word line drivers is reduced.

In some embodiments, transistors corresponding to the first gates include PMOS transistors. Transistors corresponding to the second gates and transistors corresponding to the third gates both include NMOS transistors.

Here, when the first gates, the second gates and the third gates correspond to the sub-word line driver circuits shown in FIG. 2, there may be the above correspondence relationship between the PMOS and the NMOS.

It is to be understood that in some other embodiments, transistors corresponding to the first gates include NMOS transistors. Transistors corresponding to the second gates and transistors corresponding to the third gates both include PMOS transistors. In the case, a corresponding circuit connection relationship may be adjusted according to functional requirements of the circuit.

In some embodiments, the sub-word line driver further includes a plurality of conductive contacts. Each of the conductive contacts is connected to sources or drains in the first active areas or the second active area respectively.

Referring to FIGS. 5A and 6A, a plurality of conductive contacts 407 are also provided in each of the sub-word line drivers. The conductive contacts 407 may be located on at least one side of the first gates, and are connected to sources or drains in the first active areas 403. The conductive contacts 407 may also be located on at least one side of the second gates, and are connected to sources or drains in the second active area 406.

Therefore, in the embodiments of the disclosure, by defining the extension direction of the first active areas corresponding to the first gates as the first direction, defining a direction parallel to the plane in which the first active areas are located and perpendicular to the first direction as the second direction, and setting an extension direction of at least one of a connecting line formed by the plurality of first gates and a connecting line formed by at least part of the second gates in a main-word line to intersect both the first direction and the second direction, a width of the main word line in the second direction (a projected dimension of the main word line in the first direction) can be reduced under the premise of keeping a channel length unchanged, and thus the occupied area of the sub-word line driver can be reduced, thereby improving an integration of the memory.

Embodiments of the disclosure further provides a memory including the semiconductor structure according to the above embodiments of the disclosure.

Here, reference can be made to the above related description of FIG. 1B for a layout of related structures in the memory.

The scope of protection of the disclosure is not limited thereto. Any variants or replacements that can easily be thought of by a person skilled in the technical field within the technical scope of the disclosure shall be covered within the scope of protection of the disclosure. Therefore, the scope of protection of this disclosure shall be subject to the scope of protection of the claims.

In the semiconductor structure provided by embodiments of the disclosure, by defining the extension direction of the first active areas corresponding to the first gates as the first direction, defining a direction parallel to the plane in which the first active areas are located and perpendicular to the first direction as the second direction, and setting an extension direction of at least one of a connecting line formed by the plurality of first gates and a connecting line formed by at least part of the second gates in the main-word line to intersect both the first direction and the second direction, a width of the main word line in the second direction (a projected dimension of the main word line in the first direction) can be reduced under the premise of keeping a channel length unchanged, and thus the occupied area of the sub-word line driver can be reduced, thereby improving an integration of the semiconductor structure.

What is claimed is:

1. A semiconductor structure, comprising at least one sub-word line driver, the sub-word line driver comprising:
 a plurality of first active areas; and
 a main-word line comprising a plurality of first gates and a plurality of second gates interconnected; the plurality of first gates corresponding to the plurality of first active areas;
 wherein at least one of an extension direction of the plurality of first gates in the main-word line or an extension direction of at least part of the second gates in the main-word line intersects both a first direction and a second direction; wherein the first direction is parallel to a direction in which the first active areas extend, and the second direction is parallel to a plane in which the first active areas are located and is perpendicular to the first direction.

2. The semiconductor structure of claim 1, wherein the plurality of first gates are connected physically and all extend in a third direction, the plurality of first active areas are arranged at intervals in the third direction, and at least part of the second gates are connected physically and all extend in a fourth direction; and
 an included angle between a straight line in the third direction and a straight line in the second direction ranges from 0° to 45°; or, an included angle between a straight line in the fourth direction and the straight line in the second direction ranges from 0° to 45°.

3. The semiconductor structure of claim 1, wherein the plurality of first gates are connected physically and all extend in a third direction, the plurality of first active areas are arranged at intervals in the third direction, and at least part of the second gates are connected physically and all extend in a fourth direction; and
 an included angle between a straight line in the third direction and a straight line in the second direction ranges from 0° to 45°; and, an included angle between a straight line in the fourth direction and the straight line in the second direction ranges from 0° to 45°.

4. The semiconductor structure of claim 2, wherein the plurality of first gates are physically connected and all extend in the third direction, and the plurality of second gates are physically connected to one end of the plurality of first gates and all extend in the fourth direction.

5. The semiconductor structure of claim 2, wherein the plurality of first gates are physically connected and all extend in the third direction, a part of the second gates are physically connected to one end of the plurality of first gates and all extends in the fourth direction, and another part of the second gates are physically connected to another end of the plurality of first gates and all extend in the fifth direction, wherein an included angle between a straight line in the fifth direction and the straight line in the second direction ranges from 0° to 45°.

6. The semiconductor structure of claim 5, wherein an included angle between the straight line in the fourth direction and the straight line in the third direction is a first included angle, and an included angle between the straight line in the fifth direction and the straight line in the third direction is a second included angle, wherein the first included angle is equal to the second included angle.

7. The semiconductor structure of claim 6, wherein the included angle between the straight line in the third direction and the straight line in the second direction is 45°, the plurality of first active areas are arranged at intervals in a stepping manner, the included angle between the straight line in the fourth direction and the straight line in the third direction is 45°, and the included angle between the straight line in the fifth direction and the straight line in the second direction is 45°.

8. The semiconductor structure of claim 2, wherein
the first gates as a whole extend in the third direction; or
the first gates comprise a first portion and a second portion extending in the third direction, and a third portion connecting the first portion and second portion.

9. The semiconductor structure of claim 2, wherein the semiconductor structure comprises N sub-word line drivers, where N is a positive integer greater than or equal to 1;
wherein the first gates physically connected in each of the N sub-word line drivers all are parallel and are flush at both ends; and
the second gates connected physically in each of the N sub-word line drivers all are parallel and are flush at both ends.

10. The semiconductor structure of claim 9, wherein the sub-word line driver further comprises a plurality of third gates all located between the second gates of two adjacent ones of the N sub-word line drivers.

11. The semiconductor structure of claim 10, wherein the N sub-word line drivers comprise a first sub-word line driver and a second sub-word line driver;
wherein the third gates in the first sub-word line driver and the second sub-word line driver are all located between the second gates of the first sub-word line driver and the second gates of the second sub-word line driver.

12. The semiconductor structure of claim 10, wherein the N sub-word line drivers comprise a first sub-word line driver, a second sub-word line driver, a third sub-word line driver, and a fourth sub-word line driver disposed sequentially in the first direction; and the first gates as a whole of the N sub-word line drivers extend in the first direction; wherein a distance between the second gates of the first sub-word line driver and the second gates of the second sub-word line driver is L1, a distance between the second gates of the second sub-word line driver and the second gates of the third sub-word line driver is L2, and a distance between the second gates of the third sub-word line driver and the second gates of the fourth sub-word line driver is L3, where L1=L3, and L1>L2; and
wherein the third gates of the N sub-word line drivers are located between the second gates of the first sub-word line driver and the second gates of the second sub-word line driver, and between the second gates of the third sub-word line driver and the second gates of the fourth sub-word line driver.

13. The semiconductor structure of claim 12, wherein there are active areas shared between the first gates of the second sub-word line driver and the first gates of the third sub-word line driver.

14. The semiconductor structure of claim 10, wherein the N sub-word line drivers comprise a first sub-word line driver, a second sub-word line driver, a third sub-word line driver, and a fourth sub-word line driver disposed sequentially in the first direction; and the first gates of the N sub-word line drivers comprise first portions and second portions extending in the first direction, and third portions connecting the first portions and the second portions; wherein a pitch between the first portions of the first gates of two adjacent ones of the sub-word line drivers is a first distance or a second distance, and a pitch between the second portions of the first gates of two adjacent ones of the sub-word line drivers is the second distance or the first distance, wherein the first distance is greater than the second distance; and
wherein the third gates of the N sub-word line drivers are located between the second gates connected to portions of two adjacent ones of the first gates with a pitch of the first distance in the N sub-word line drivers.

15. The semiconductor structure of claim 14, wherein there are the first active areas shared between portions of two adjacent ones of the first gates with a pitch of the second distance in the N sub-word line drivers.

16. The semiconductor structure of claim 10, wherein two adjacent ones of the third gates in the first direction are formed in a "C" shape or an "I" shape.

17. The semiconductor structure of claim 10, wherein transistors corresponding to the first gates comprise P-type transistors; transistors corresponding to the second gates and transistors corresponding to the third gates both comprise N-type transistors.

18. The semiconductor structure of claim 10, wherein the sub-word line driver further comprises at least one second active area corresponding to the plurality of second gates and the plurality of third gates; and
wherein a shape of each of the first active areas is a strip shape, and a shape of the second active area is a grid shape.

19. The semiconductor structure of claim 18, wherein the sub-word line driver further comprises a plurality of conductive contacts; wherein each of the conductive contacts is connected to sources or drains in the first active areas or the second active area respectively.

20. A memory, comprising:
the semiconductor structure of claim 1.

* * * * *